(12) United States Patent
Takahashi

(10) Patent No.: US 9,130,573 B2
(45) Date of Patent: Sep. 8, 2015

(54) SIGNAL PROCESSING APPARATUS, SIGNAL PROCESSING METHOD AND COMMUNICATION APPARATUS

(71) Applicant: Sony Corporation, Tokyo (JP)

(72) Inventor: Katsuaki Takahashi, Kanagawa (JP)

(73) Assignee: Sony Corporation, Tokyo (JP)

( * ) Notice: Subject to any disclaimer, the term of this patent is extended or adjusted under 35 U.S.C. 154(b) by 94 days.

(21) Appl. No.: 13/780,528

(22) Filed: Feb. 28, 2013

(65) Prior Publication Data

US 2013/0257556 A1 Oct. 3, 2013

(30) Foreign Application Priority Data

Mar. 30, 2012 (JP) ................. 2012-082532

(51) Int. Cl.
| | |
|---|---|
| H03D 3/02 | (2006.01) |
| H03L 7/00 | (2006.01) |
| H03J 3/08 | (2006.01) |
| H03L 7/08 | (2006.01) |
| H03L 7/099 | (2006.01) |
| H03L 7/183 | (2006.01) |
| H03D 9/02 | (2006.01) |
| H03D 9/06 | (2006.01) |
| H03D 1/04 | (2006.01) |

(52) U.S. Cl.
CPC ... *H03L 7/00* (2013.01); *H03J 3/08* (2013.01); *H03L 7/0805* (2013.01); *H03L 7/099* (2013.01); *H03L 7/183* (2013.01); *H03D 1/04* (2013.01); *H03D 9/02* (2013.01); *H03D 9/06* (2013.01); *H03J 2200/08* (2013.01); *H03J 2200/10* (2013.01)

(58) Field of Classification Search
CPC ............. H03D 1/04; H03D 9/02; H03D 9/06; H03L 7/00; H03L 7/0805; H03L 7/099; H03L 7/183; H03J 3/08; H03J 2200/08; H03J 2200/10
USPC .......... 331/36 C, 117 R, 117 FE, 167, 177 V; 455/283, 296, 306, 307; 329/318, 323, 329/337, 339, 349; 375/143, 144, 148, 346, 375/348, 340
See application file for complete search history.

(56) References Cited

U.S. PATENT DOCUMENTS

| | | | |
|---|---|---|---|
| 4,521,916 A * | 6/1985 | Wine | 455/182.1 |
| 6,681,102 B1 * | 1/2004 | Collier et al. | 455/296 |
| 6,954,115 B2 * | 10/2005 | Wong | 333/17.1 |
| 7,019,598 B2 * | 3/2006 | Duncan et al. | 331/176 |
| 7,227,917 B2 * | 6/2007 | Auranen | 375/346 |
| 2010/0130158 A1 | 5/2010 | Khoini-Poorfard et al. | |
| 2011/0115566 A1 * | 5/2011 | Moon et al. | 331/16 |

OTHER PUBLICATIONS

S. Kang et al., "*A Triband 65nm CMOS Tuner for ATSC Mobile DTV SoC*", Samsung Electronics, Korea, 2010 IEEE Radio Frequency Integrated Circuits Symposium, pp. 185-188 (2010).

* cited by examiner

*Primary Examiner* — Arnold Kinkead
*Assistant Examiner* — Richard Tan
(74) *Attorney, Agent, or Firm* — Fishman Stewart Yamaguchi PLLC

(57) ABSTRACT

Disclosed herein is a signal processing apparatus including: a voltage-controlled oscillation block having a parameter high in correlation with a filter; a measuring block configured to measure an oscillation frequency of the voltage-controlled oscillation block; and a control block configured to control the parameter of the filter by use of a measuring result of the oscillation frequency obtained by the measuring block.

19 Claims, 8 Drawing Sheets

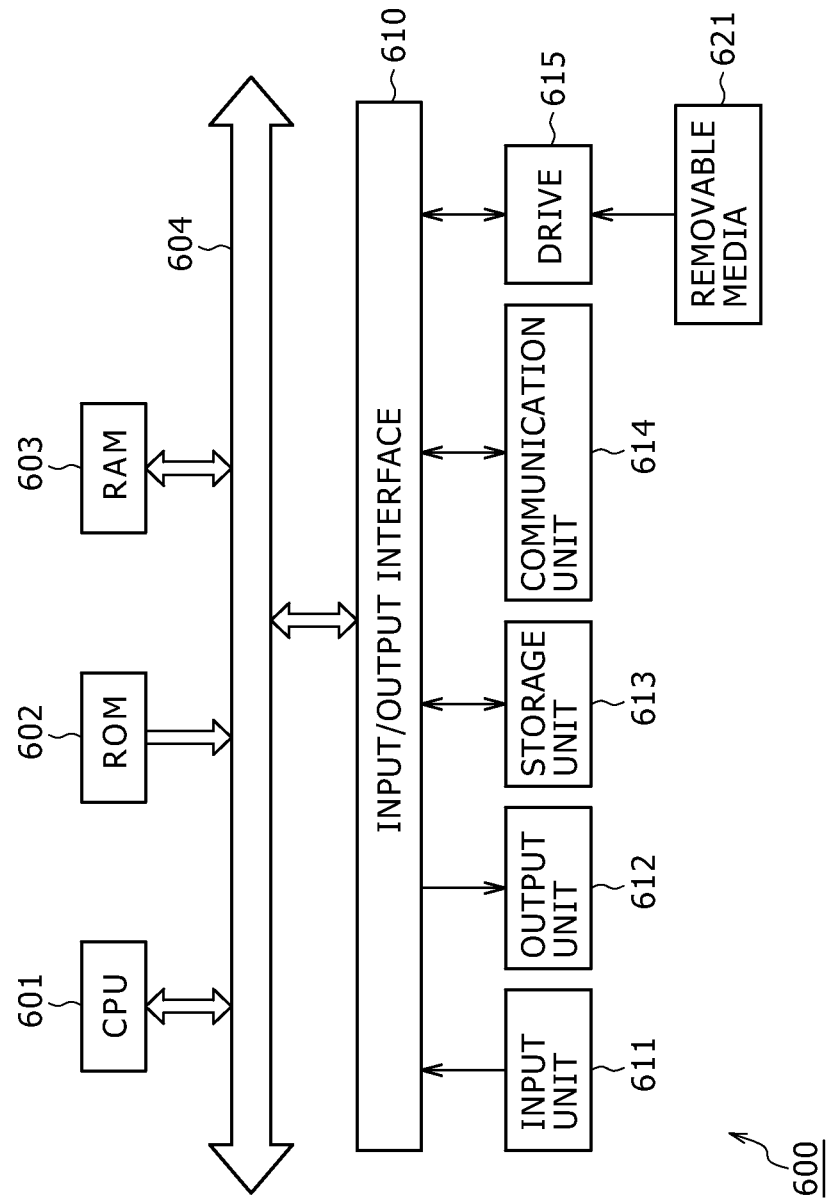

SIGNAL PROCESSING APPARATUS, SIGNAL PROCESSING METHOD AND COMMUNICATION APPARATUS

BACKGROUND

The present disclosure relates to a signal processing apparatus, a signal processing method and a communication apparatus and, more particularly, to a signal processing apparatus, a signal processing method and a communication apparatus that facilitate parameter control of filters.

In related-art receivers that select only a desired frequency by limiting the band of a reception frequency, a filter is used before or after a high-frequency amplifier. However, this filter possibly poses a fear of causing a deviation between the desired reception frequency and a filter tuning frequency (or cutoff frequency) due to process fluctuations of capacitors built in an LSI (Large Scale Integration) chip.

Such a deviation in a tuning frequency (or cutoff frequency) may deteriorate anti-interference or noise performance. Hence it is necessary for receivers to correct the filter capacitance fluctuations.

A method is known of correcting the filter capacitance fluctuations by checking codes of capacitor banks that are −3 dB on the low frequency side and the high frequency side of an entered test tone to select an intermediate code, for example, thereby correcting the capacitance fluctuations (for example, refer to US 2010/0130158A1, hereinafter referred to as Patent Document).

Another method is also known in which a negative Gm cell and an LC (Inductance-capacitance) tuning circuit are interconnected and a capacitor bank is adjusted so as to make a reception frequency which a PLL (Phase Locked Loop) synthesizer locked equal to an oscillation frequency of the LC tuning circuit, thereby correcting capacitance fluctuations, for example, (for example, refer to Sanghoon Kang, Huijung Kim, Jeong-Hyun Choi, Jae-Hong Chang, Jong-Dae Bae, Wooseung Choo and Byeong-ha Park, Samsung Electronics, Korea, "A Triband 65 nm CMOS Tuner for ATSC Mobile DTV SoC," 2010 IEEE Radio Frequency Integrated Circuits Symposium, hereinafter referred to as Non-Patent Document).

SUMMARY

However, the above-mentioned methods require a circuit additionally adapted to correct capacitance fluctuations. Namely, these methods possibly increases circuit scale and production cost that are otherwise unnecessary.

The above-mentioned methods also require an adjustment time for the correction of capacitance fluctuations. Namely, an otherwise unnecessary time is added to channel selection time, thereby possibly increasing the channel selection time.

For example, in the case of the method disclosed in Patent Document shown above, a test tone generator must be newly arranged. In addition, an adjustment time must be added to the channel selection time.

In the case of the method described in Non-Patent Document shown above, a negative Gm cell circuit must be added. In addition, an adjustment time must be added to the channel selection time.

The present disclosure has been made in view of above-described circumstances and it is desired to provide a signal processing apparatus, a signal processing method and a communication apparatus that facilitate parameter control of filters.

According to an embodiment of the present disclosure, there is provided a signal processing apparatus. This signal processing apparatus includes: a voltage-controlled oscillation block having a parameter high in correlation with a filter; a measuring block configured to measure an oscillation frequency of the voltage-controlled oscillation block; and a control block configured to control the parameter of the filter by use of a measuring result of the oscillation frequency obtained by the measuring block.

According to another embodiment of the present disclosure, there is provided a signal processing method for a signal processing apparatus. This signal processing method is executed by the signal processing apparatus and includes: measuring an oscillation frequency of a voltage-controlled oscillation block having a parameter high in correlation with a filter; and controlling the parameter of the filter by use of a measuring result of the oscillation frequency.

According to a further embodiment of the present disclosure, there is provided a communication apparatus. This communication apparatus includes: a reception block configured to receive a signal; a filter configured to extract a predetermined frequency component from a signal received by the reception block; a voltage-controlled oscillation block having a parameter high in correlation with the filter; a measuring block configured to measure an oscillation frequency of the voltage-controlled oscillation block; and a control block configured to control the parameter of the filter by use of a measuring result of the oscillation frequency obtained by the measuring block.

In the embodiments of the present disclosure, an oscillation frequency of a voltage-controlled oscillation block having a parameter high in correlation with a filter is measured to control the parameter of the filter by use of a measuring result of the oscillation frequency.

In the embodiments of the present disclosure, a signal is received, a predetermined frequency component is extracted from the received signal, an oscillation frequency of a voltage-controlled oscillation block having a parameter high in correlation with a filter is measured, and the parameter of the filter is controlled by use of a measuring result of the oscillation frequency.

According to the embodiments of the present disclosure, signals can be processed. Especially, filter parameter control can be executed more easily than related-art technologies.

BRIEF DESCRIPTION OF THE DRAWINGS

Other objects and advantages of the present disclosure will become apparent from the following description of embodiments with reference to the accompanying drawings in which:

FIG. 8 is a block diagram illustrating an exemplary main configuration of a computer.

DETAILED DESCRIPTION OF THE PREFERRED EMBODIMENTS

The present disclosure will be described in further detail by way of modes in which the present disclosure is practiced (hereafter referred to as embodiments) with reference to the accompanying drawings. The description will be provided in the following order:
1. First embodiment (signal processing apparatus);
2. Second embodiment (display apparatus); and
3. Third embodiment (computer).

<1. First Embodiment>
[1-1. Signal Processing Apparatus]

Figure 1:
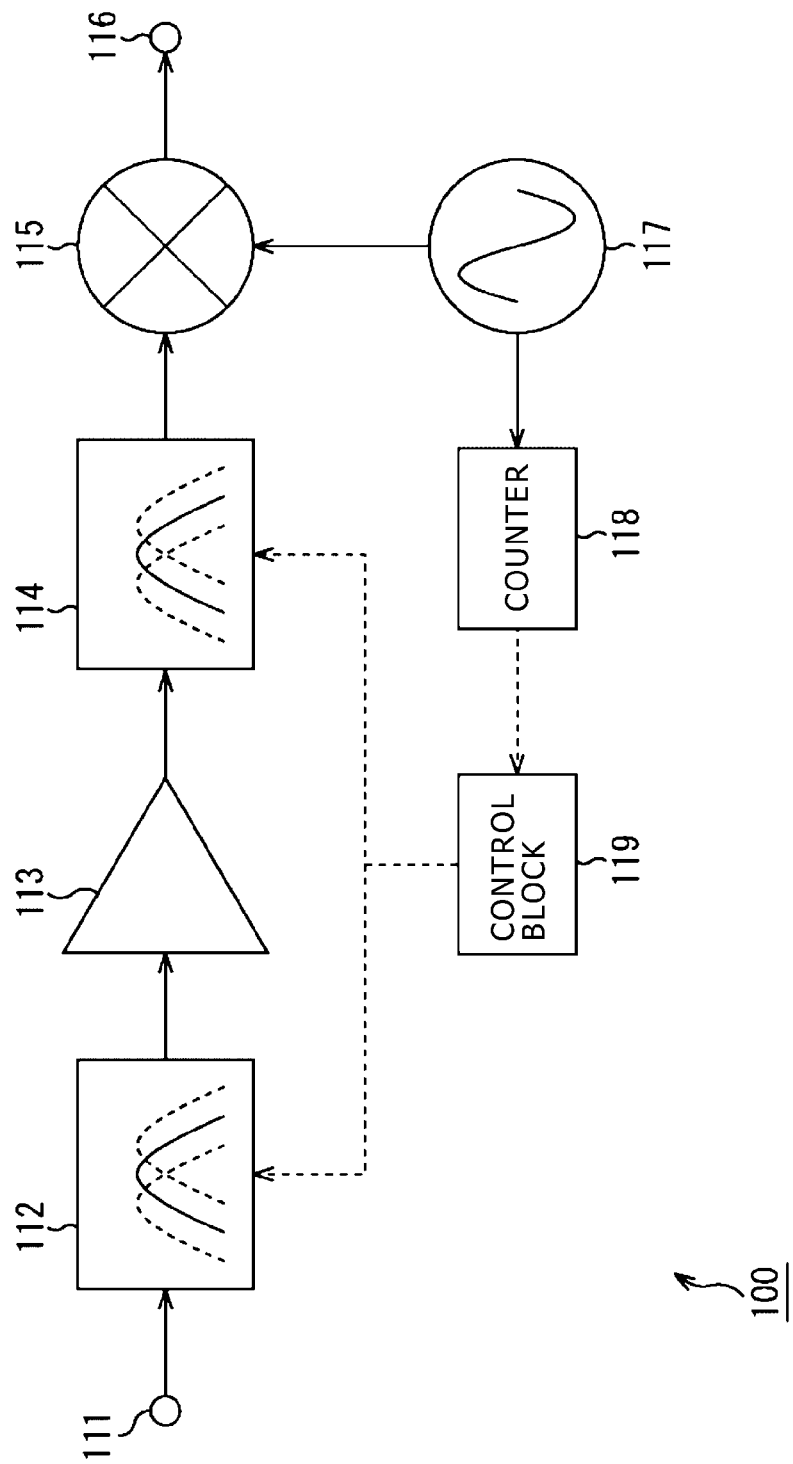
FIG. 1 is a block diagram illustrating an exemplary main configuration of a signal processing apparatus.

FIG. 1 is a block diagram illustrating an exemplary main configuration of the signal processing apparatus. A signal processing apparatus 100 shown in FIG. 1 extracts a desired frequency component from an entered signal. The signal processing apparatus 100, used for a receiver configured to receive wireless signals, for example, extracts a component of a desired channel (or a band) from a reception signal and outputs the extracted component.

The signal processing apparatus 100 has an input terminal 111, a filter 112, an amplification block 113, a filter 114, a mixer 115, an output terminal 116, a VCO 117, a counter 118, and a control block 119.

A signal entered through the input terminal 111 is supplied to the filter 112. The filter 112 extracts a component of a predetermined tuning frequency (a frequency other than a cutoff frequency) from the supplied signal and supplies the extracted component to the amplification block 113.

The amplification block 113 is a high-frequency amplification block configured to amplify a supplied signal. The amplification block 113 supplies the amplified signal to the filter 114.

The filter 114 extracts a component of a predetermined tuning frequency (a frequency other than a cutoff frequency) of the supplied signal and supplies the extracted component to the mixer 115.

Figure 2:
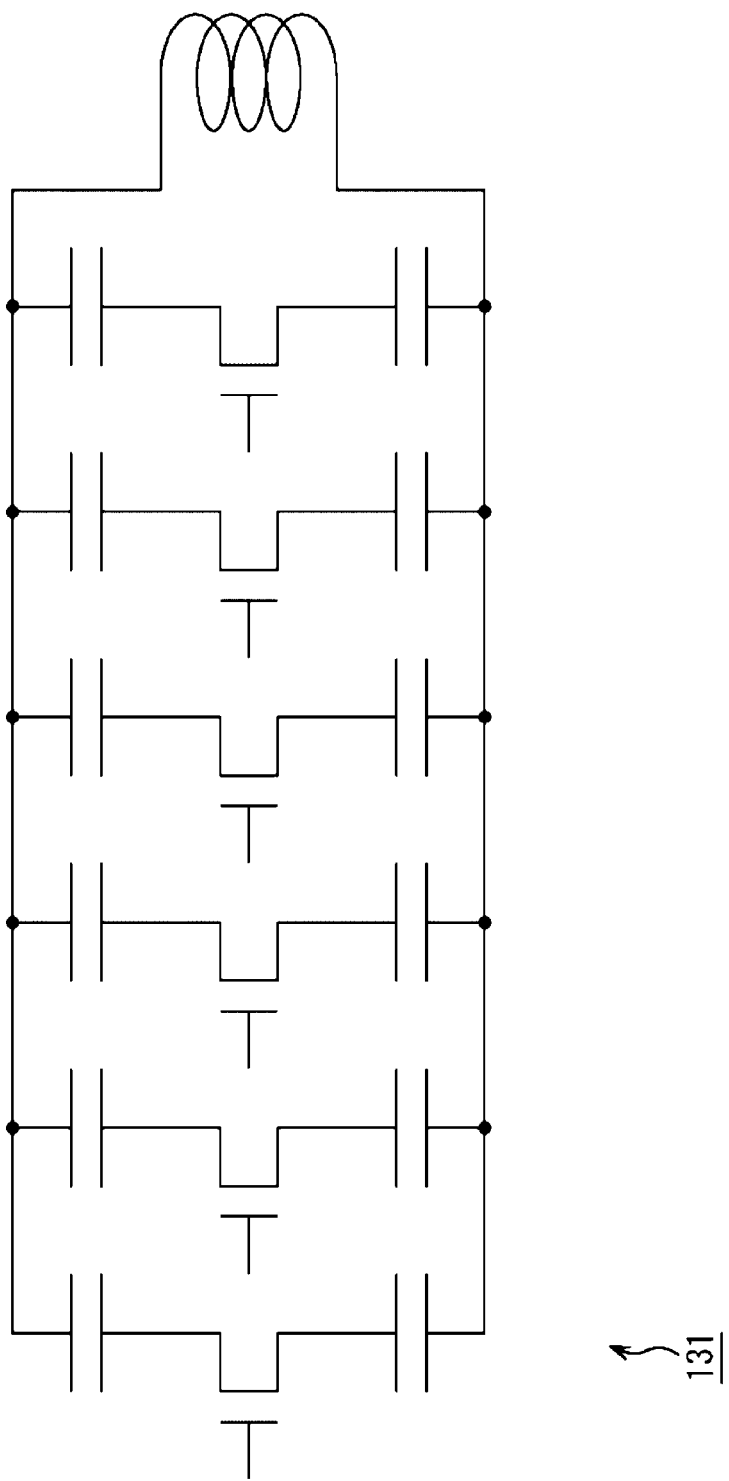
FIG. 2 is a circuit diagram illustrating an exemplary configuration of a capacitor bank.

The filter 112 and the filter 114 each have a capacitor bank 131 as shown in FIG. 2. As shown in FIG. 2, this capacitor bank 131 has two or more capacitors, switches, and an inductor. Every time these switches are turned on/off, the capacitance can be controlled. Namely, the filter 112 and the filter 114 have variable capacitors. To be more specific, the filter 112 and the filter 114 each have inductor L and capacitor C as parameters.

The mixer 115 multiplies the supplied signal by an output signal of the VCO 117. To be more specific, the mixer 115 extracts a frequency (or an oscillation frequency) component of the output signal of the VCO 117 from the signal supplied from the filter 114. The mixer 115 supplies the result of the multiplication (namely, the extracted component) to the output terminal 116 to output the extracted component to the outside.

The VCO 117 can control an oscillation frequency by voltage. The VCO 117 supplies an output signal of a voltage-controlled frequency band to the mixer 115 and the counter 118. The VCO 117 has parameters that are high in correlation with the parameters of the filter 112 and the filter 114. For example, the VCO 117 has the inductor L and capacitor C same as those of the filter 112 and the filter 114 as parameters.

The counter 118 measures the frequency of the output signal of the VCO 117.

On the basis of the measuring result obtained by the counter 118, the control block 119 controls the parameters of the filter 112 and the filter 114. For example, on the basis of the frequency measuring result supplied from the counter 118, the control block 119 controls the capacitance of the capacitor bank 131, namely, the capacitance of each filter.

Figure 3:
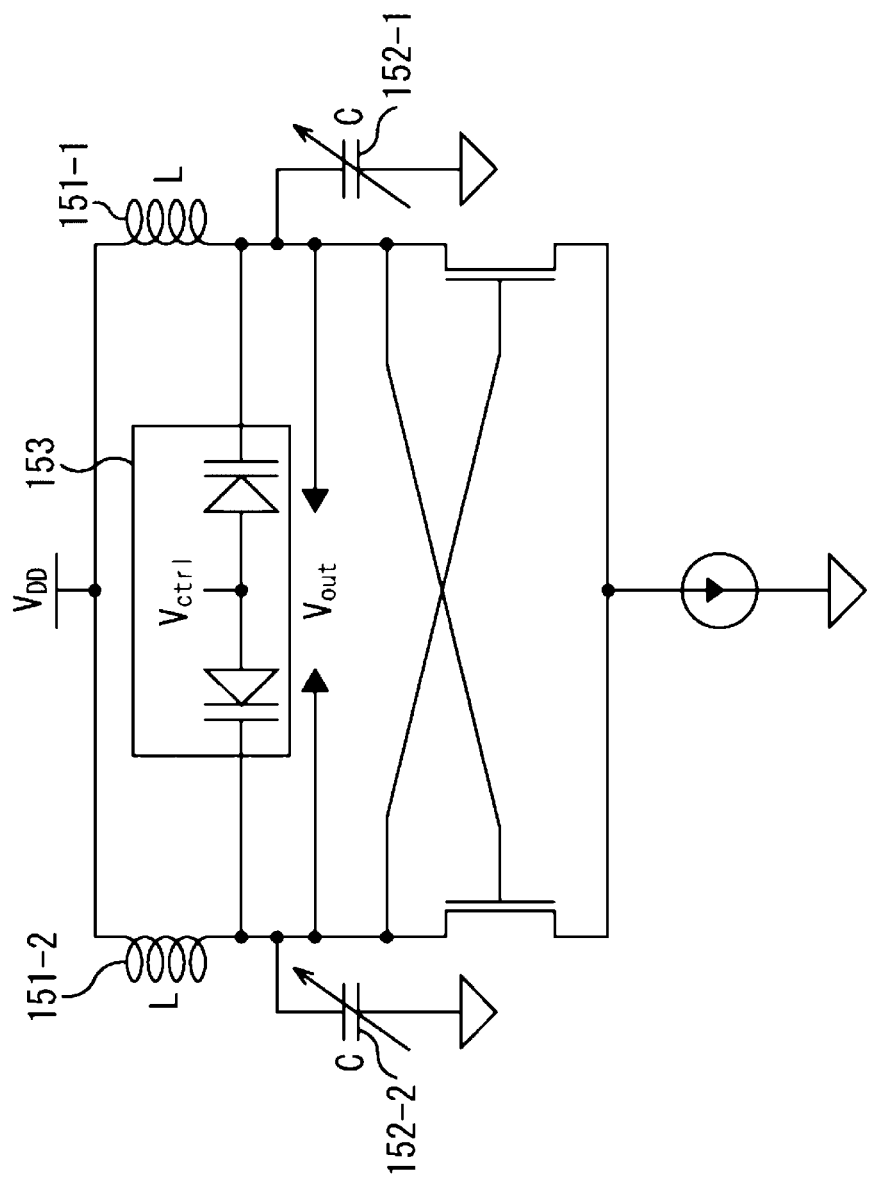
FIG. 3 is a circuit diagram illustrating an exemplary main configuration of an LCVCO (LC Voltage Controlled Oscillator)

The following describes a station tuning operation of the signal processing apparatus 100. Receivers required for high reception performance need to achieve a low phase noise. For this purpose, an LCVCO made up of an inductor 151-1, an inductor 151-2, a capacitor bank 152-1, a capacitor bank 152-2, a varactor 153, and a negative Gm cell is used for a PLL as shown in FIG. 3.

It should be noted that, in what follows, the inductors 151-1 and 151-2 are generically referred to simply as the inductor 151 unless otherwise noted and the capacitor banks 152-1 and 152-2 are generically referred to simply as the capacitor bank 152 unless otherwise noted.

The capacitor bank 152 is substantially the same as the capacitor banks 131 of the filter 112 and the filter 114 described with reference to FIG. 2.

At the time of channel tuning, the counter 118 measures the frequency of the VCO 117 by switching capacitor values (or capacitor bank codes) of the capacitor bank 152 by operating the PLL in an open loop.

Figure 5:
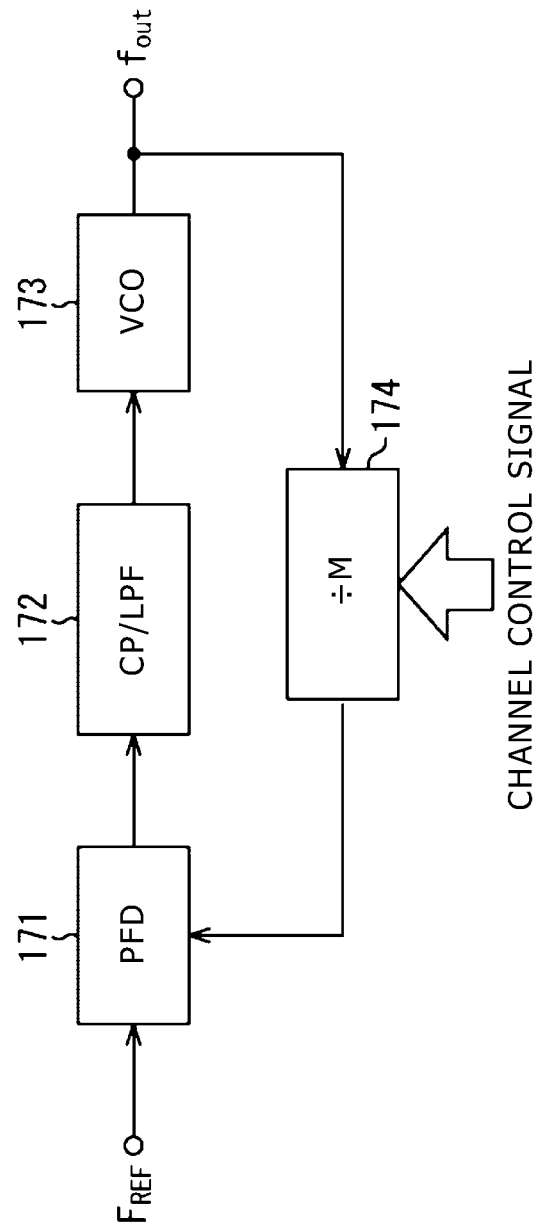
FIG. 5 is a schematic diagram illustrating an exemplary main configuration of a PLL.

When the frequency (reception frequency) of the signal entered from the input terminal 111 and the oscillation frequency of the VCO 117 have gotten close to a predetermined level, the PLL is operated in a closed loop to lock with the reception frequency as shown in FIG. 5.

In FIG. 5, the PLL has a phase comparison block (or PFD (Phase Frequency Detector)) 171, a CP (Charge pump)/LPF (Low-Pass Filter) 172, a VCO 173, and divider 174.

Such an operation is executed as a general tuning operation.

The control block 119 uses the result of the above-mentioned sequence of tuning operations to execute capacitance adjustment. At the time of channel tuning, for example, the PLL is first operated in an open loop and frequency measurement is executed by the counter 118 by switching the capacitance values of the capacitor banks. The result obtained by this operation is reused for capacitance adjustment computation.

Let the above-mentioned result explicitly be FREQ_CNT_READ and a pre-evaluated standard sample frequency measuring result be FREQ_CNT_TYP, then FREQ_CNT_READ and FREQ_CNT_TYP may be expressed by equations (1) and (2) below.

$$\text{FREQ\_CNT\_TYP} = \frac{1}{\sqrt{(C\text{var} + C\text{bank\_t}) * L}} \quad (1)$$

$$\text{FREQ\_CNT\_READ} = \frac{1}{\sqrt{(C\text{var} + C\text{bank\_p}) * L}} \quad (2)$$

where

Cvar=varactor capacitance (known);

Cbank_t=standard sample capacitance value (known); and

Cbank_p=fluctuation capacitance value (unknown).

If inductance L is deleted from the equations (1) and (2) above, then the fluctuation capacitance value Cbank_p is expressed by equation (3) below.

$$Cbank\_p = Cbank\_t \left(\frac{FREQ\_CNT\_TYP}{FREQ\_CNT\_READ}\right)^2 + \quad (3)$$
$$Cvar\left\{\left(\frac{FREQ\_CNT\_TYP}{FREQ\_CNT\_READ}\right)^2 - 1\right\}$$

By transforming above-mentioned equation (3), a fluctuation coefficient may be expressed as shown in equation (4) below.

$$\text{Fluctuation coefficient} = \quad (4)$$
$$\frac{\left(\frac{FREQ\_CNT\_TYP}{FREQ\_CNT\_READ}\right)^2 (CAP\_RATIO+1) - 1}{CAP\_RATIO}$$

where $$CAP\_RATIO = \frac{Cbank\_t}{Cvar} \quad (5)$$

Storing the known values of FREQ_CNT_TYP and CAP_RATIO into a memory beforehand allows the control block 119 to obtain a fluctuation coefficient by computation, thereby adjusting a capacitor bank code.

It should be noted that fluctuations in the capacitance of the varactor 153 causes a computation error, but this may be ignored by making CAP_RATIO (a ratio between varactor capacitance and standard sample capacitance) comparatively large.

Actually, however, a fluctuation also occurs in inductor L. It should be noted that a fluctuation in inductor L is included in a fluctuation of capacitance C in a transformation of equation (3) shown above.

The control block 119 obtains the fluctuation coefficient from the frequency measuring result obtained by the counter 118 as described above and multiplies the obtained fluctuation coefficient by each capacitance of the filter 112 and the filter 114. Consequently, the capacitance values of the filter 112 and the filter 114 can be corrected.

Figure 4:
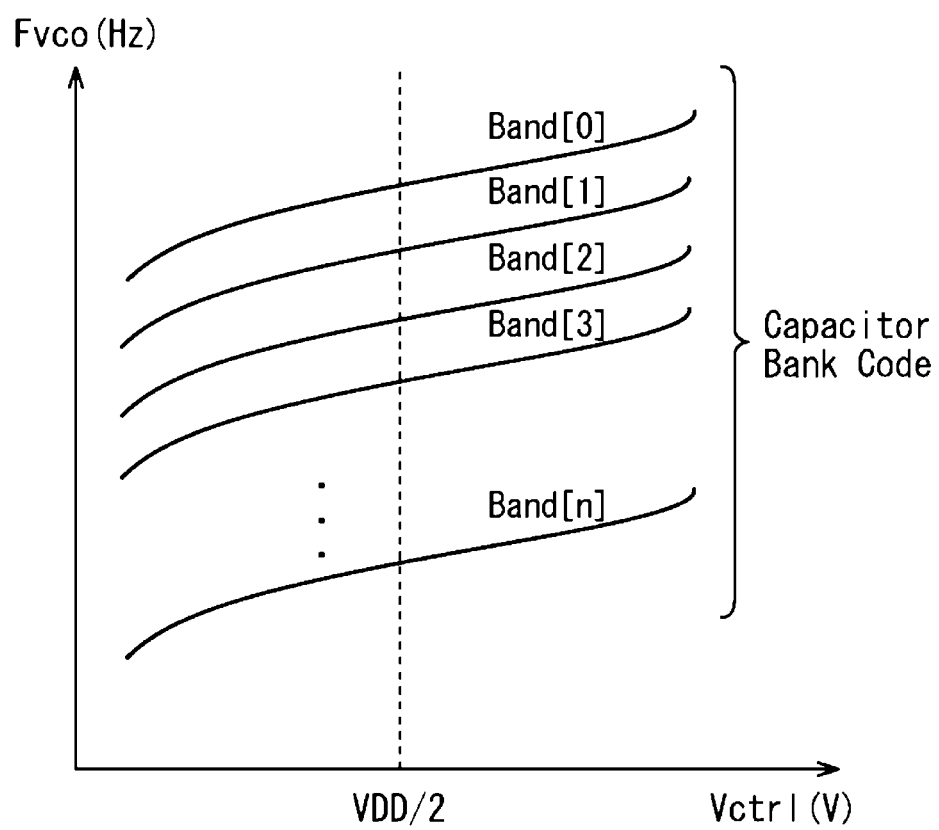
FIG. 4 is a graph indicative of an example of frequency versus control voltage characteristics for each band of a VCO.

The above-mentioned processing does not require the addition of new circuits or processing blocks. The above-mentioned processing can be executed by use of the frequency measuring result of a first channel (Band[0] shown in FIG. 4). Therefore, setting a new time need not be executed for capacitance adjustment, thereby preventing channel tuning time from getting longer.

By use of a frequency oscillation measuring result of a VCO having parameters that are high in correlation with a filter, the control block 119 can easily execute filter parameter adjustment.

[1-2. Flow of Processing]

Figure 6:
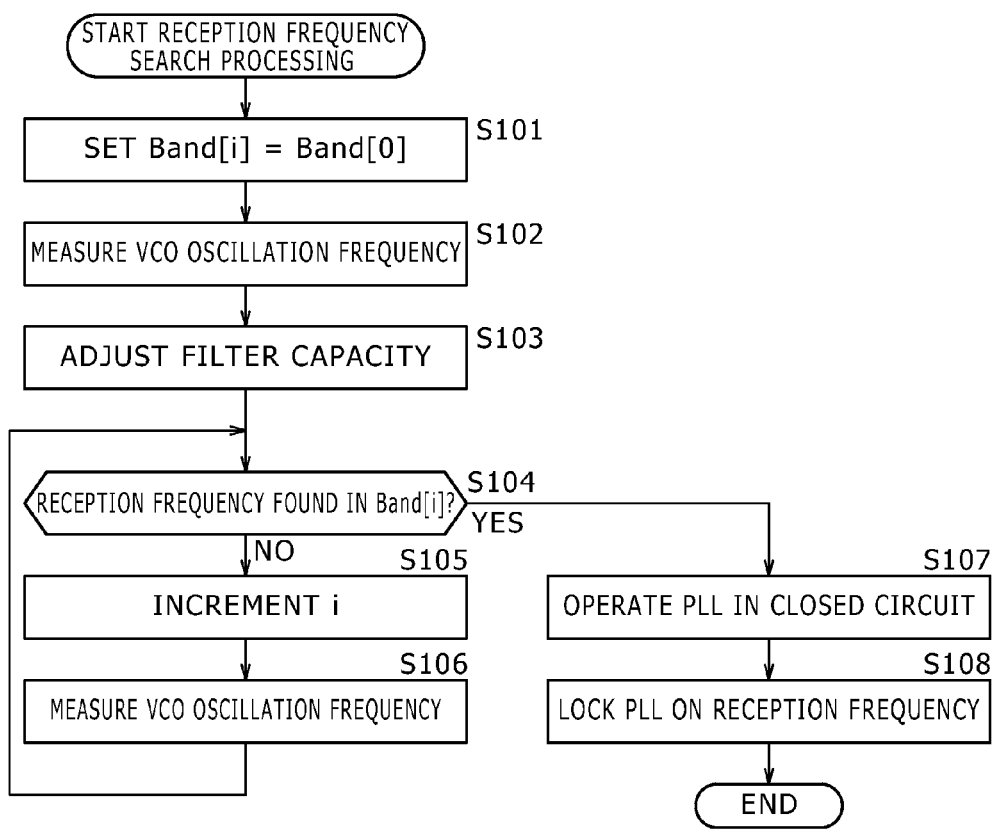
FIG. 6 is a flowchart indicative of an exemplary flow of reception frequency search processing.

The following explains an exemplary flow of reception frequency search processing that is executed by the signal processing apparatus 100 with reference to the flowchart shown in FIG. 6.

When the reception frequency search processing starts, the control block 119 sets Band[i]=Band[0] in step S101. In step S102, the counter 118 measures a VCO oscillation frequency. In step S103, on the basis of the measuring result obtained in step S102, the control block 119 adjusts the capacitance of the filter 112 and the filter 114. This processing is executed concurrently with the processing to be executed in step S104 and subsequent steps that will be explained later.

In step S104, on the basis of the measuring result obtained in step S102, the VCO 117 determines whether there is a reception frequency in Band[i] or not. If a reception frequency is not found in Band[i], then the procedure goes to step S105.

In step S105, the VCO 117 increments variable i by one. In step S106, the counter 118 measures an oscillation frequency of the VCO 117. When the processing in step S106 comes to an end, the procedure is returned to step S104. It should be noted that, in the case of the processing of step S104 that is executed second time or more, the VCO 117 determines whether there is a reception frequency in Band[i] on the basis of the measuring result obtained in step S106.

If a reception frequency is found in Band[i] in step S104, then the procedure goes to step S107.

In step S107, the VCO 117 operates the PLL in a closed loop. In step S108, the VCO 117 locks the PLL onto the reception frequency.

When the processing of step S108 comes to an end, the signal processing apparatus 100 terminates the reception frequency search processing.

Executing the above-mentioned processing as described above allows the signal processing apparatus 100 to easily control filter parameters.

[1-3. Others]

It should be noted that, in the description done above, the two filters (the filter 112 and the filter 114) arranged before and after the amplification block 113 are controlled, any other number of filters to be controlled and any other filter positions may be arbitrarily determined.

In the description done above, the signal processing apparatus 100 executes the processing of extracting a desired frequency component from an input signal as signal processing; it is also practicable for the signal processing apparatus 100 to arbitrarily execute other signal processing.

The parameters of filters that are controlled by the control block 119 may be any other than capacitor C described above. The VCO 117 may only have parameters that are high in correlation with the filter parameters.

<2. Second Embodiment>

[Display Apparatus]

Figure 7:
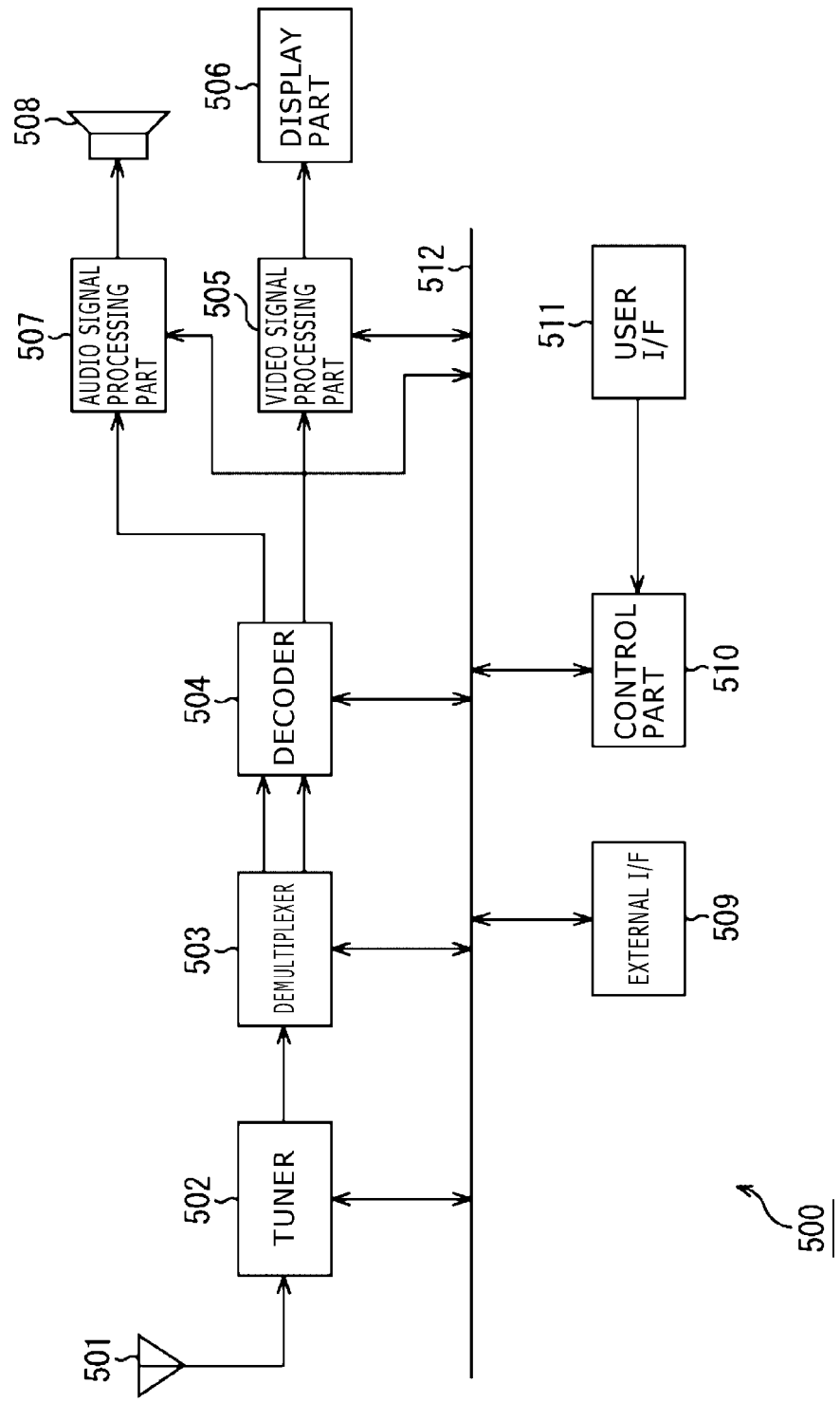
FIG. 7 is a block diagram illustrating an exemplary main configuration of a display apparatus.

Referring to FIG. 7, there is shown an exemplary main configuration of a display apparatus with the above-mentioned signal processing apparatus 100 used as a processing part. A display apparatus 500 shown in FIG. 7 is a reception apparatus configured to receive broadcast wave (television signals, for example) and display a received image. The display apparatus 500 has an antenna 501, a tuner 502, a demultiplexer 503, a decoder 504, a video signal processing part 505, a display part 506, an audio signal processing part 507, a speaker 508, an external interface (I/F) 509, a control part 510, a user I/F 511, and a bus 512, for example.

The tuner 502 extracts a signal of a desired channel from a broadcast signal received through the antenna 501 and demodulates the extracted signal. The tuner 502 then outputs a coded bit stream obtained by the demodulation to the demultiplexer 503. Namely, the tuner 502 plays a role of a transmission part in the display apparatus 500 that receives a coded stream with an image encoded.

The demultiplexer 503 separates a video stream and an audio stream of a program to be viewed from the coded bit stream and outputs the separated streams to the decoder 504. The demultiplexer 503 extracts auxiliary data such as EPG (Electronic Program Guide) from the coded bit stream and supplies the extracted data to the control part 510. It should be noted that, if a coded bit stream is scrambled, the demultiplexer 503 may descramble the scrambled bit stream.

The decoder 504 decodes the video stream and the audio stream entered from the demultiplexer 503. The decoder 504 then outputs video data generated by the decode processing to the video signal processing part 505. The decoder 504 outputs audio data generated by the decode processing to the audio signal processing part 507.

The video signal processing part 505 reproduces the video data entered from the decoder 504 and displays the reproduced video data onto the display part 506. The video signal processing part 505 may display an application screen supplied via a network onto the display part 506. The video signal processing part 505 may execute additional processing such as noise cancellation for example on the video data in accordance with settings. The video signal processing part 505 may generate GUI (Graphical User Interface) images such as a menu, a button, and a cursor, for example, and superimpose the generated images onto an output image.

The display part 506, driven by a drive signal supplied from the video signal processing part 505, displays a video or an image onto a video screen of a display device (an LCD (Liquid Crystal Display) panel, a plasma display, or an OELD (Organic Electro-Luminescence Display) panel, for example).

The audio signal processing part 507 executes reproduction processing such as D/A (digital/analog) conversion and amplification on the audio data entered from the decoder 504 and outputs sounds from the speaker 508. The audio signal processing part 507 may execute additional processing such as noise cancellation on the audio data.

The external I/F 509 provides an interface between the display apparatus 500 and external equipment or a network. For example, a video stream or an audio stream received via the external I/F 509 may be decoded by the decoder 504. To be more specific, the external I/F 509 also plays a role of a transmission part in the display apparatus 500 that receives a coded stream with an image encoded.

The control part 510 has a processor such as a CPU (Central Processing Unit) and memories such as a RAM (Random Access Memory) and a ROM (Read Only Memory). The memories store programs to be executed by the CPU, program data, EPG data, and data obtained through a network, for example. Each program stored in the memories is, for example, read by the CPU at the activation of the display apparatus 500 and executed. Executing stored programs, the CPU controls an operation of the display apparatus 500 in accordance with an operation signal entered from the user I/F 511, for example.

The user I/F 511 is connected to the control part 510. The user I/F 511 has buttons and switches for a user to operate the display apparatus 500 and a remote control signal reception portion, for example. The user I/F 511 generates an operation signal by detecting a user operation through these component elements and outputs the generated operation signal to the control part 510.

The bus 512 interconnects the tuner 502, the demultiplexer 503, the decoder 504, the video signal processing part 505, the audio signal processing part 507, the external I/F 509, and the control part 510.

For the tuner 502 of the display apparatus 500 configured as described above, the signal processing apparatus 100 described above is used. Therefore, the display apparatus 500 can execute filter parameter control more easily.

<3. Third Embodiment>
[Computer]

The above-mentioned sequence of processing operations may be executed by software as well as hardware. If the above-mentioned sequence of processing operations is executed by software, programs constituting the software are installed in a computer. The computer here includes a computer which is built in dedicated hardware equipment or a general-purpose personal computer in which various programs may be installed for the execution of various functions.

Referring to FIG. 8, there is shown a block diagram of an exemplary hardware configuration of a computer that executes the above-mentioned sequence of processing operations by software programs.

In a computer 600 shown in FIG. 8, a CPU 601, a ROM 602, and a RAM 603 are interconnected by a bus 604.

The bus 604 is connected with an input/output interface 610. The input/output interface 610 is connected with an input unit 611, an output unit 612, a storage unit 613, a communication unit 614, and a drive 615.

The input unit 611 includes a keyboard, a mouse, a microphone, a touch panel, and an input terminal, for example. The output unit 612 includes a display, a speaker, and an output terminal, for example. The storage unit 613 includes a hard disk, a RAM disk, and a nonvolatile memory, for example. The communication unit 614 includes a network interface for example. The drive 615 drives a removable media 621 such as a magnetic disk, an optical disk, a magneto optical disk, or a semiconductor memory.

With the computer 600 configured as described above, the CPU 601 loads a program from the storage unit 613 into the RAM 603 via the input/output interface 610 and the bus 604 for execution, thereby executing the above-mentioned sequence of processing operations. The RAM 603 also stores, arbitrarily, data necessary for the CPU 601 to execute various processing operations.

Each program to be executed by the computer 600 (or the CPU 601) may be recorded to the removable media 621 that is a package media for example to be applied. Each program may be provided through a wired or wireless transmission media such as a local area network, the Internet, and digital satellite broadcasting.

In the computer 600, each program may be installed, via the input/output interface 610, in the storage unit 613 by loading the removable media 621 in which that program is recorded onto the drive 615. Each program may be received at the communication unit 614 via wired or wireless transmission media to be installed in the storage unit 613. Each program may be installed in the ROM 602 or the storage unit 613 in advance.

It should be noted that each program to be executed by the computer may be executed in a time-dependent manner along the sequence described herein, in a parallel manner, or in an on-demand basis.

It should also be noted that, herein, the steps of describing a program recorded to a recording media may include processing to be executed in parallel or individually in addition to processing to be executed in a time-dependent manner in accordance with the sequence described herein.

It should be noted that, herein, a system denotes a collection of two or more component elements (apparatuses or modules (parts)), whether or not all the component elements are arranged in a single housing. Therefore, two or more apparatuses arranged in separate housings and interconnected via a network and one apparatus in which two or more modules are arranged in one housing are a system each.

A configuration described as one apparatus (or a processing block) may be divided and configured as two or more apparatuses (or processing blocks). Conversely, a configuration described above as two or more apparatuses (or processing blocks) may be configured into one apparatus (or one processing block). A configuration other than those described above may be added to the configuration of each apparatus (or each processing block). If a configuration or an operation of an entire system is substantially the same, part of the configuration of a certain apparatus (or a certain processing block) may be included in the configuration of another apparatus (or another processing block).

While preferred embodiments of the present disclosure have been described using specific terms, such description is for illustrative purpose only, and it is to be understood that changes and variations may be made without departing from the spirit or scope of the following claims.

For example, the present disclosure may take a configuration of cloud computing in which one function is burdened between two or more apparatus via a network for joint processing.

It should be noted that each of the steps described with reference to the above-mentioned flowchart may be executed in one apparatus or two or more apparatuses in a distributed manner.

If two or more processing operations are included in one step, then these processing operations may be executed in one apparatus or two or more apparatuses in a distributed manner.

It should be noted that the present disclosure may also take the following configurations.

(1) A signal processing apparatus including:
a voltage-controlled oscillation block having a parameter high in correlation with a filter;
a measuring block configured to measure an oscillation frequency of the voltage-controlled oscillation block; and
a control block configured to control the parameter of the filter by use of a measuring result of the oscillation frequency obtained by the measuring block.

(2) The signal processing apparatus according to (1) above, in which the parameter is capacitance.

(3) The signal processing apparatus according to (2) above, in which the voltage-controlled oscillation block is an inductance-capacitance voltage-controlled oscillator having inductance and capacitance.

(4) The signal processing apparatus according to any one of (1) to (3) above,
in which the measuring block measures the oscillation frequency as a channel tuning operation, and
the control block controls the parameter of the filter by use of a result of the channel tuning operation executed by the measuring block.

(5) The signal processing apparatus according to any one of (1) to (4) above, in which the control block computes a fluctuation coefficient by use of a frequency measuring result obtained by the measuring block and a standard sample frequency measuring result to control the parameter of the filter by use of the computed fluctuation coefficient.

(6) The signal processing apparatus according to any one of (1) to (5) above, in which the control block controls parameters of a plurality of filters.

(7) A signal processing method for a signal processing apparatus, the method executed by the signal processing apparatus, including:
measuring an oscillation frequency of a voltage-controlled oscillation block having a parameter high in correlation with a filter; and
controlling the parameter of the filter by use of a measuring result of the oscillation frequency.

(8) A communication apparatus including:
a reception block configured to receive a signal;
a filter configured to extract a predetermined frequency component from a signal received by the reception block;
a voltage-controlled oscillation block having a parameter high in correlation with the filter;
a measuring block configured to measure an oscillation frequency of the voltage-controlled oscillation block; and
a control block configured to control the parameter of the filter by use of a measuring result of the oscillation frequency obtained by the measuring block.

The present disclosure contains subject matter related to that disclosed in Japanese Priority Patent Application JP 2012-082532 filed in the Japan Patent Office on Mar. 30, 2012, the entire content of which is hereby incorporated by reference.

What is claimed is:

1. A signal processing apparatus comprising:
a voltage-controlled oscillation block having a parameter that is correlated with a parameter of a filter;
a measuring block configured to measure an oscillation frequency of the voltage-controlled oscillation block; and
a control block configured to control the parameter of the filter by use of a measuring result of the oscillation frequency obtained by the measuring block,
wherein the control block computes a fluctuation coefficient by use of a frequency measuring result obtained by the measuring block and a standard sample frequency measuring result, and controls the parameter of the filter by use of the computed fluctuation coefficient.

2. The signal processing apparatus according to claim 1, wherein the parameter of the filter is capacitance.

3. The signal processing apparatus according to claim 2, wherein the voltage-controlled oscillation block is an inductance-capacitance voltage-controlled oscillator having inductance and capacitance.

4. The signal processing apparatus according to claim 1,
wherein the measuring block measures the oscillation frequency as a channel tuning operation, and
the frequency measuring result that is used by the control block for computing the fluctuation coefficient is a result of the measuring block measuring the oscillation frequency as the channel tuning operation.

5. The signal processing apparatus according to claim 1, wherein the control block controls parameters of a plurality of filters, including the filter, by use of the computed fluctuation coefficient.

6. A signal processing method for a signal processing apparatus, the method executed by the signal processing apparatus, comprising:
measuring an oscillation frequency of a voltage-controlled oscillation block having a parameter that is correlated with a parameter of a filter;
computing a fluctuation coefficient by using a result of the measuring of the oscillation frequency and a standard sample frequency measuring result; and
controlling the parameter of the filter by use of the computed fluctuation coefficient.

7. The method according to claim 6, wherein the parameter of the filter is capacitance.

8. The method according to claim 7, wherein the voltage-controlled oscillation block is an inductance-capacitance voltage-controlled oscillator having inductance and capacitance.

9. The method according to claim 6,
wherein the measuring of the oscillation frequency of the voltage-controlled oscillation block is accomplished by using a channel tuning operation, and
the frequency measuring result used for computing the fluctuation coefficient is a result of the channel tuning operation.

10. The method according to claim 6, further comprising:
controlling parameters of a plurality of filters, including the filter, by use of the computed fluctuation coefficient.

11. A communication apparatus comprising:
a reception block configured to receive a signal;
a filter configured to extract a predetermined frequency component from the signal received by the reception block;
a voltage-controlled oscillation block having a parameter that is correlated with a parameter of the filter;
a measuring block configured to measure an oscillation frequency of the voltage-controlled oscillation block; and
a control block configured to control the parameter of the filter by use of a measuring result of the oscillation frequency obtained by the measuring block,
wherein the control block computes a fluctuation coefficient by use of a frequency measuring result obtained by the measuring block and a standard sample frequency measuring result, and controls the parameter of the filter by use of the computed fluctuation coefficient.

12. The communication apparatus according to claim 11, wherein the parameter of the filter is capacitance.

13. The communication apparatus according to claim 12, wherein the voltage-controlled oscillation block is an inductance-capacitance voltage-controlled oscillator having inductance and capacitance.

14. The communication apparatus according to claim 11, wherein the measuring block measures the oscillation frequency as a channel tuning operation, and
the frequency measuring result that is used by the control block for computing the fluctuation coefficient is a result of the measuring block measuring the oscillation frequency as the channel tuning operation.

15. The communication apparatus according to claim 11, wherein the control block controls parameters of a plurality of filters, including the filter, by use of the computed fluctuation coefficient.

16. The communication apparatus according to claim 11, further comprising:
a mixer that is downstream of the filter and mixes the received signal with an oscillation signal output from the voltage-controlled oscillation block.

17. A communication apparatus comprising:
a receiver circuit that receives a signal;
a filter that is downstream of the receiver circuit and that extracts a portion of the received signal;
a voltage-controlled oscillator that has a parameter that is correlated with a parameter of the filter and that outputs an oscillation signal;
a mixer that is downstream of the filter and mixes the received signal with the oscillation signal;
a measuring circuit that measures an oscillation frequency of the voltage-controlled oscillator; and
a control circuit that computes a fluctuation coefficient by use of a frequency measuring result obtained by the measuring circuit and a standard sample frequency measuring result, and variably controls the parameter of the filter by using the computed fluctuation coefficient.

18. The communication apparatus of claim 17,
wherein the parameter of the filter is capacitance and the parameter of the voltage-controlled oscillator that is correlated with the parameter of the filter is capacitance.

19. The communication apparatus of claim 18,
wherein the control circuit controls the parameter of the filter by multiplying a present capacitance of the filter by the computed fluctuation coefficient and setting a new capacitance of the filter to a result of the multiplication.

* * * * *